United States Patent [19]

Pinkhasov

[11] Patent Number: 4,898,623
[45] Date of Patent: Feb. 6, 1990

[54] METHOD OF SHAPING HARD DIFFICULT-TO-ROLL ALLOYS

[75] Inventor: Eduard Pinkhasov, Eastchester, N.Y.

[73] Assignee: Vapor Technologies Inc., Mt. Vernon, N.Y.

[21] Appl. No.: 282,609

[22] Filed: Dec. 9, 1988

[51] Int. Cl.⁴ .................... B22D 23/00; C22F 1/18
[52] U.S. Cl. .......................... 148/3; 164/46; 164/61; 427/37
[58] Field of Search ............ 164/46, 61; 427/37; 148/3

[56] References Cited

U.S. PATENT DOCUMENTS

| | | | |
|---|---|---|---|
| 3,270,381 | 9/1966 | Smith, Jr. ................ | 164/46 |
| 3,729,046 | 4/1973 | Kennedy et al. ........... | 164/61 X |
| 4,481,999 | 11/1984 | Duchane et al. .......... | 164/46 X |
| 4,505,948 | 3/1985 | Pinkhasov ............... | 427/37 |
| 4,537,794 | 8/1985 | Pinkhasov ............... | 427/37 |
| 4,805,294 | 2/1989 | Siemers ................. | 164/46 X |

Primary Examiner—Richard K. Seidel
Assistant Examiner—J. Reed Batten, Jr.
Attorney, Agent, or Firm—Herbert Dubno

[57] ABSTRACT

Hard difficult-to-roll alloys are shaped by forming a mold of plastic, especially a polyacrylate, with a highly smooth surface onto which the alloy is deposited by low-temperature arc vapor deposition. The alloy layer is then separated from the plastic substrate and subjected to heat treatment to increase its density.

18 Claims, 1 Drawing Sheet

METHOD OF SHAPING HARD DIFFICULT-TO-ROLL ALLOYS

FIELD OF THE INVENTION

My present invention relates to a method of shaping hard difficult-to-roll alloys and specifically lightweight hard alloys.

BACKGROUND OF THE INVENTION

In recent years there has been an increasing interest in metal alloys which are not only hard but are of relatively light weight. Such materials include, for example, titanium-aluminum alloys and others which have a highly crystalline structure and are difficult to roll. Attempts to roll such alloys may embrittle them, cause the formation of stress cracks and likewise alter the structural soundness of the product.

Other shaping methods generally cannot be used in a practical manner for the fabrication of large-size objects. For example, such materials cannot be turned or milled effectively because of their hardness and other shaping methods than electric-discharge machining, for example, can be impractical or unsatisfactory.

Electric-discharge machining may not be able to economically create desired shapes in large objects, especially if complex configurations such as fuselage, air foil, air guide and vane configurations are involved.

Accordingly, at the present time there is no common commercial and technologically acceptable way of forming shaped bodies from $TiAl_3$ and similar hard and difficult-to-roll alloys.

Mention should be made of the fact that in my copending application Ser. No. 941,185 filed Dec. 12, 1986 and now U.S. Pat. No. 4,828,934 and the patents and applications mentioned therein, I have described a low-temperature arc vapor deposition method of depositing metals and metal compounds or metal alloys upon a variety of substrates with high-bonding strength and unique properties of the applied layers. The technique has been used effectively to create a variety of metal structures, to produce ceramics, to coat ceramics and to create compounds and compositions of various formations upon a variety of substrates.

Essentially the technique involves striking an arc between electrodes including at least one electrode of a material to be deposited on a substrate, in an evacuated space, and causing vaporization of the electrode material with the low-voltage, high-current arc which then results.

OBJECTS OF THE INVENTION

It is the principal object of the present invention, therefore, to provide an improved method of forming shaped bodies from hard difficult-to-roll alloys and particularly titanium-aluminum alloys.

Another object of this invention is to provide bodies of hard-alloy composition, high density and relatively complex shape without deterioration of hardness and structural stability.

SUMMARY OF THE INVENTION

These objects and others which will become apparent hereinafter are attained, in accordance with the invention, in a method of making shaped bodies of hard difficult-to-roll alloys which comprises forming a vapor of the alloy true to the composition of the alloy desired in the body by low-temperature arc vapor generation and depositing the alloy from the vapor in an evacuated space upon a synthetic resin substrate from which the deposited layer can be removed true to its deposited shape and composition. According to the invention, moreover, the layer is then subjected to heat treatment to increase its density while it maintains its shape as removed from the substrate.

I have found that polyacrylate substrates, constituted as shaping molds, can be readily configured to a wide variety of shapes, e.g. by deep-drawing or other methods utilizing thermal conformation to a particular shape and can be provided with a highly finished surface upon which the alloy layer can be deposited.

Generally speaking, in accordance with this invention, the alloy can be deposited in a thickness of 0.001 to 0.1 inch and preferably to a thickness of 0.005 to 0.01 inch.

The vapor can be generated by striking an arc between two electrodes across which a relatively low voltage of 20 to 150 volts is applied in a space evacuated to at most $10^{-3}$ torr using an arc current of 30 to 150 amperes.

The composition of the vapor can be adjusted to the desired alloy composition in a number of ways. For example, I have found quite surprisingly that it is possible to fabricate both of the electrodes as the desired alloys with ease because the particular shape of the electrode is not important. When electrodes of the alloy composition are used, surprisingly the vapor has the desired composition and the layer deposits with the desired composition, i.e. without compositional change.

Alternatively, one of the electrodes may contribute certain of the elements of the final alloy composition to the vapor while the other electrode contributes other elements of the composition thereto. Of course, more than two electrodes can be used with the additional electrodes contributing other elements if desired.

Preferably the invention is employed to produce doubly-curved relatively thin bodies of titanium-aluminum alloys, e.g. for use for the purposes mentioned.

I have found, moreover, that it is important that the deposition of titanium-aluminum alloys as described above be effected from an environment which is as free from oxygen as is possible, in order to ensure the high metallurgical quality of the alloy.

While the limitations in the amount of oxygen present can be simply brought about by evacuating the vapor-deposition space to very low pressures, for example $10^{-8}$ torr, e.g. prior to commencement of vapor deposition and the striking of the arc, I have also found that it is possible to reduce the oxygen content by a getter effect independently of or in conjunction with evacuation to the very low pressures described.

For example, I may allow the evaporation chamber to communicate only with another chamber from which oxygen has been removed through the use of titanium vapor or titanium films as a getter. In that case, for example, the additional chamber may be evacuated to, for example, $10^{-7}$ torr, and an ark struck between titanium electrodes to coat surfaces of this additional chamber with a thin film of titanium.

The thin film of titanium appears to trap any residual oxygen by a getter effect and hence any leakage into the vapor deposition chamber will be devoid of oxygen. The vapor deposition chamber itself may be previously internally coated with titanium by effecting vapor deposition from titanium electrodes therein s that a getter effect is also exercised directly within the vapor deposition chamber.

BRIEF DESCRIPTION OF THE DRAWING

The above and other objects, features and advantages of the present invention will become more readily apparent from the following description, reference being made to the accompanying drawing in which.

SPECIFIC DESCRIPTION

Figure 1:
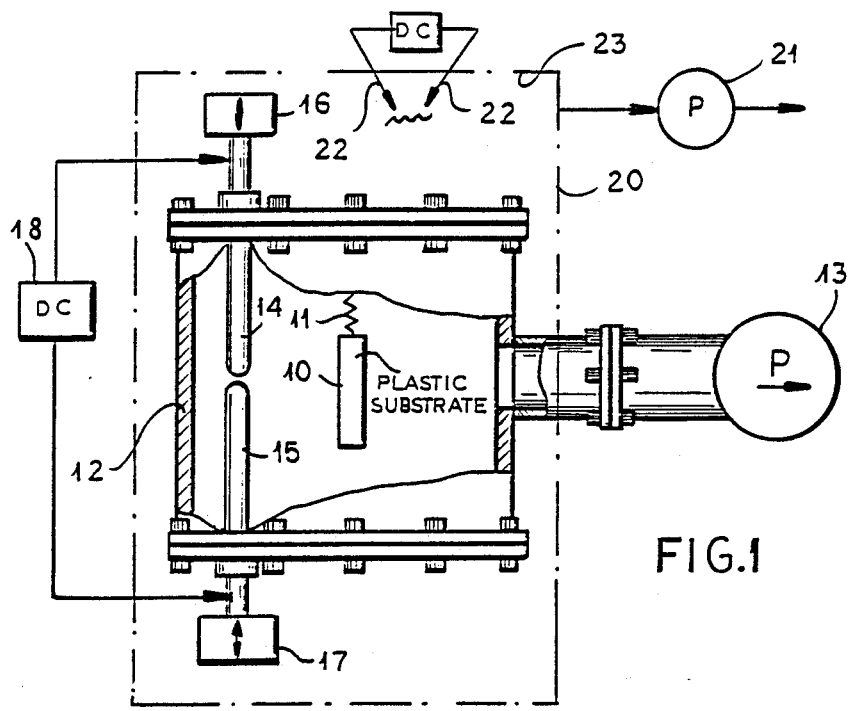
FIG. 1 is an elevational view, particularly broken away, of an apparatus for producing the shaped bodies of the present invention.

Referring to FIG. 1, it can be seen that a plastic substrate 10 which can be composed of a polyacrylate, and especially polymethylmethacrylate is mounted at 11 in a chamber 12 which can be evacuated by a suction pump 13 to a pressure of at most $10^{-3}$ torr although lower pressures are preferred in this chamber.

A pair of electrodes 14, 15 are provided and at least one of them can be advanced into contact and withdrawn from the other by an electrode advancing or reciprocating mechanism 16 or 17. A power supply 18 is provided to apply a voltage of 20 to 150 volts across the electrodes and to supply a current of 30 to 150 amperes. Both electrodes may be constituted, as noted, of the desired alloy composition in the finished body or, one of the electrodes 14 may consist of one group of components while the other electrode 15 is constituted of another component.

Before effecting vapor deposition on the substrate 10 as has been previously described and will be described in greater detail hereinafter, I have found it to be advantageous to remove traces of oxygen from the ambient atmosphere remaining in the deposition chamber 12.

To that end, before the substrate 10 is exposed to the vapor generated by arc discharge in the striking of an arc between the electrodes 14 and 15, the interior of the chamber 12 may be coated with a thin layer of titanium by the striking of an arc under the conditions described between a pair of titanium electrodes. At very low pressures, e.g. pressures of $10^{-7}$ to $10^{-8}$ torr, most of the oxygen in the spaces is drawn off with the evacuated gases, while the balance of the oxygen appears to be trapped in the titanium layer which functions as a getter so that the environment in which the formation of the aluminum, niobium, tantalum and titanium vapor is produced is particularly free from oxygen.

Another pair of electrodes may generate the titanium coating for getter purposes and it is advantageous to permit any leakage into the chamber 12 or any flow of gas into that chamber to derive from a further chamber 20 which has previously been evacuated by the pump 21 to a vacuum of $10^{-7}$ to $10^{-8}$ torr and an arc struck between titanium electrodes 22 in a manner similar to that which has been described. Since the surfaces 23 of the chamber 20 are thinly coated with titanium, a getter effect is exercised in the space through which communication can later be effected by leakage into the coating chamber so that any leakage gases are likewise particularly free of oxygen.

Other techniques for freeing the vapor space from oxygen, including massive flushing with gases which may contain titanium vapor with the substrate shielded from coating, can be used as well.

The first electrode 14, for example, may be constituted of 91.5% by weight titanium, 7.5% by weight niobium and 1.5% by weight tantalum, while the other electrode is constituted of high-purity aluminum to produce a vapor which is constituted, for example, of 33% by weight aluminum 5% by weight niobium, 1% by weight tantalum and the balance titanium.

The deposit consists of the latter alloy composition, known commercially as TiAl₃ and the two electrodes may be constituted of this latter composition if desired.

In any case, the layer deposits true to the vapor composition.

Figure 2:
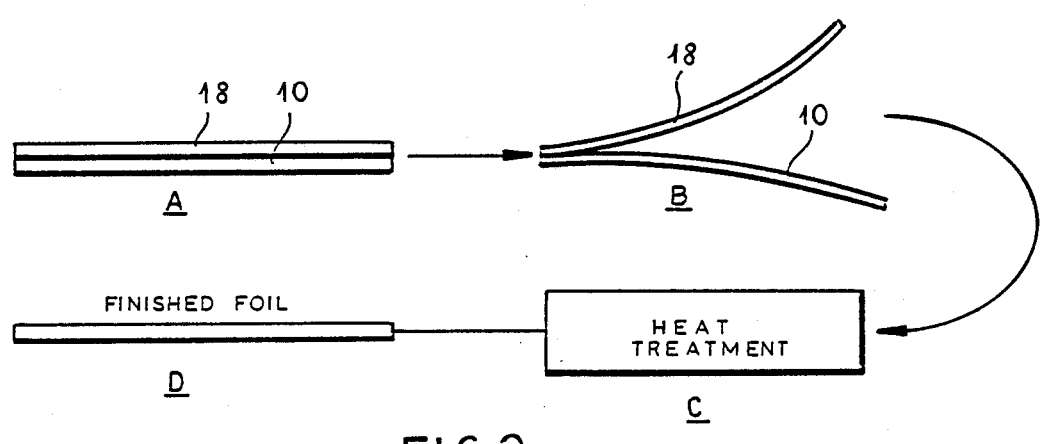
FIG. 2 is a diagram illustrating the steps in the method.

Referring now to FIG. 2, it can be seen that the layer 24 is built up on the polyacrylate substrate 10 to the desired thickness, e.g. 5 to 10 mils in step A in the chamber of FIG. 1, for example, and the layer 24 is separated from the substrate 10 as shown in step B.

The layer retains its original form upon separation. In this Figure, the shape of the substrate has been shown to be flat so that the layer has the configuration of a sheet.

Figure 3:
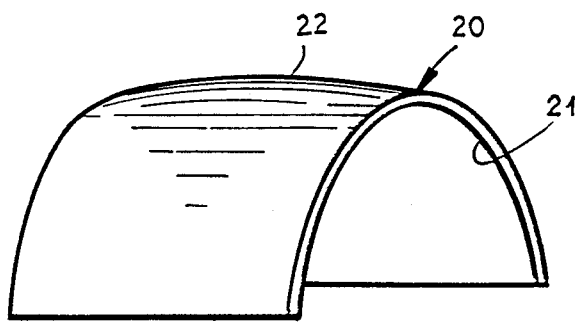
FIG. 3 is a perspective view showing a shaped body as made by the method of the invention.

However, as has been shown in FIG. 3, the layer 24 may have a double-curved configuration to form a nacelle, an aircraft pod, a fuselage part or an airfoil part. The interior surface 25 or the exterior surface 26 can have an exceptionally smooth finish if it is the surface which was originally formed on the shaping mold of the polyacrylate. The opposite surface may have a rough texture. If the outer surface 26 is to be smooth, a negative mold, i.e. a cavity mold, may be used while, if the inner surface 25 is to be smoother, a positive or convex mold may be used.

In any case, the shaped object after separation from the mold is subjected to heat treatment in step C, e.g. in a furnace to which an inert gas such as argon is fed.

The heat treatment, temperatures and durations will, of course, depend upon the degree of densification desired. Preferably a density of at least 95% of the solid alloy is desirable. The finished product, following heat treatment is shown at D and has a desired alloy composition and shape.

SPECIFIC EXAMPLE

A shaped TiAl₃ body is formed by depositing on a polymethylmethacrylate mold of complementary configuration to the body desired, a 10 mil thick layer utilizing electrodes of a composition of 93% Al, 5% Nb, 1% Ta and the balance Ti (all by weight), utilizing a voltage of 50 volts and an arc current of 75 amperes. The space 12 was evacuated to a pressure of $10^{-5}$ torr.

The layer was then pulled off the polymethylmethacrylate substrate and subjected to heat treatment in an argon atmosphere at a temperature of 1400° C. for a period of four hours. Density measurements were taken and the heat treatment terminated when the density reached approximately 98% of solid density of the TiAl₃ alloy of the composition: 33% by weight Al, 5% by weight Nb, 1% by weight Ta, balance titanium.

The surface of the body which had been in contact with the polymethylmethacrylate mold was found to resemble a superfinished surface and had a highly polished appearance without any machining effort. The composition of the body was identical to that of the electrodes.

Mechanical tests showed that the body had the hardness and other structural characteristics of the solid alloy of the latter composition.

I claim:

1. A method of making objects from difficult-to-roll alloys, comprising the steps of:
   (a) depositing upon a synthetic resin substrate having a shape complementary to a shape to be imparted to a difficult-to-roll alloy, a layer of said alloy of approximately a final thickness of an object of said shape to be fabricated from said alloy, by striking an arc between electrodes at least one of which is constituted of at least one metal of said alloy in an evacuated space to form a vapor of the composition of said alloy and depositing said layer from said vapor on said substrate, whereby the composition of said layer is substantially true to the composition of said vapor;
   (b) removing said layer from said substrate; and
   (c) heat-treating the layer removed from said substrate to increase the density of said layer.

2. The method defined in claim 1 wherein said arc is struck by contacting one of said electrodes with the other electrode and applying a voltage of substantially 20 to 150 volts across said electrodes in a space evacuated to a pressure of at most $10^{-3}$ torr and has an arc current of substantially 30 to 150 amperes.

3. The method defined in claim 2 wherein at least one of said electrodes contains titanium.

4. The method defined in claim 3 wherein the other of said electrodes contains aluminum.

5. The method defined in claim 2 wherein said one of said electrodes consists of the alloy $TiAl_3$.

6. The method defined in claim 2 wherein said vapor consists of the alloy $TiAl_3$.

7. The method defined in claim 2 wherein said thickness is substantially 0.005 to 0.1 inch.

8. The method defined in claim 7 wherein said thickness is substantially 0.005 to 0.01 inch.

9. The method defined in claim 2 wherein heat treatment is carried out in step (c) to a density of said layer which is at least 95% of the density of the solid alloy.

10. The method defined in claim 1 wherein said alloy is an alloy of titanium and aluminum.

11. The method defined in claim 10 wherein said alloy is $TiAl_3$.

12. The method defined in claim 3, further comprising the step of reducing the oxygen content in ambient gas within said space during step (a).

13. The method defined in claim 12 wherein the oxygen content of the ambient gas is reduced by allowing said gas to contact a titanium layer forming a getter for oxygen in said ambient gas.

14. The method defined in claim 13 wherein said layer is vapor deposited by the striking of an arc between titanium electrodes.

15. The method defined in claim 14 wherein said titanium layer is deposited by striking an arc with one of the electrodes used in step (a) and constituted from titanium.

16. The method defined in claim 1, further comprising the step of reducing an oxygen content in said evacuated space by evacuating same to a pressure of at most $10^{-7}$ torr.

17. The method defined in claim 16, further comprising the step of coating a surface in said evacuated space with titanium to form a getter for oxygen.

18. The method defined in claim 1, further comprising the step of reducing oxygen in said evacuated space by communicating said evacuated space with a further space containing a layer of arc deposited titanium and evacuated to a pressure of at most $10^{-7}$ torr.

* * * * *